(12) United States Patent
Miller

(10) Patent No.: US 6,377,594 B1
(45) Date of Patent: Apr. 23, 2002

(54) APPARATUS AND METHOD FOR ANALYSIS AND CONTROL OF A TRAIN OF HIGH SPEED, HIGH POWER, MULTI-LEVEL LASER PULSES

(75) Inventor: Kevin L Miller, Loveland, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/419,279

(22) Filed: Oct. 15, 1999

(51) Int. Cl.[7] .................................................. H01S 3/10
(52) U.S. Cl. ..................................... 372/25; 372/29.014
(58) Field of Search ............................... 372/25, 29.014, 372/30, 31

(56) References Cited

U.S. PATENT DOCUMENTS

| | | | | |
|---|---|---|---|---|
| 5,128,950 A | * | 7/1992 | Tsuchiya et al. | 372/25 |
| 5,726,789 A | * | 3/1998 | Horiuchi et al. | 359/184 |
| 5,767,953 A | * | 6/1998 | McEwan | 356/5.01 |
| 5,926,492 A | * | 7/1999 | Yoshida et al. | 372/6 |
| 5,995,228 A | * | 11/1999 | Otani et al. | 356/364 |

* cited by examiner

Primary Examiner—James W. Davie
Assistant Examiner—Davienne Monbleau
(74) Attorney, Agent, or Firm—Jack Lenell

(57) ABSTRACT

An apparatus and method for automatically analyzing and controlling intensity of a train of high speed, high power multi-level optical pulses. The invention includes an optical pulse generator for generating the train of high speed, high power, multi-level optical pulses, wherein the optical pulse generator provides a low optical intensity level and a medium optical intensity level and a high optical intensity level. A photodetector is optically coupled with the optical pulse generator for generating a train of electrical pulses having amplitude levels in response to optical intensity levels of the train of optical pulses. At least one reference is employed, wherein an analyzer electrically coupled with the reference and the photodetector for analyzing the amplitude levels of the train of electrical pulses in comparison to the reference. A controller is electrically coupled with analyzer for generating a high correction signal based upon the analysis of the amplitude levels.

20 Claims, 6 Drawing Sheets

APPARATUS AND METHOD FOR ANALYSIS AND CONTROL OF A TRAIN OF HIGH SPEED, HIGH POWER, MULTI-LEVEL LASER PULSES

FIELD OF THE INVENTION

The invention generally relates to electro-optics, and more specifically relates to analysis and control of trains of high speed multi-level optical pulses.

BACKGROUND OF THE INVENTION

Initially, even simple trains of high speed, high power LASER pulses could only be generated by specially trained technicians utilizing a room full of complex and specialized laboratory equipment.

Various factors such as changes in ambient temperature, drift of LASER bias voltages, variations in optical assemblies, and the like cause changes in optical intensity of such trains of high speed, high power LASER pulses, resulting in deviations from a desired optical intensity level.

It may be possible to monitor the optical intensity of such trains of high speed, high power LASER pulses using previously known arrangements, such as extremely high speed sample and hold circuits, peak detectors employing extremely high speed operational amplifiers and diodes, and the like. While these arrangements provide some advantages, they are typically relatively complex, expensive, and difficult to manufacture, use and maintain.

Today, because of mass production and mass merchandising of consumer electronic devices such as readable/re-writeable Compact Disc (CD) drives and the like, ordinary people can generate a train of high speed, high power multi-level LASER pulses within an area less then five and one quarter inches wide (of course, most such people are unaware that they are doing so.)

Write operations typically require that write pulses within the pulse train last for only approximately sixteen to approximately eight nanoseconds or less and have high optical intensity levels of approximately thirty to approximately one hundred milliwatts or more. Similarly, erase operations typically require that erase pulses within the pulse train last for approximately one hundred and fourteen to approximately forty-five nanoseconds or less. However, the erase operations typically require that the erase pulses within the pulse train have a medium optical intensity levels (less than the high optical intensity levels of the write pulses) limited to approximately half of the write pulse intensity, or approximately fifteen to approximately fifty milliwatts or more. Duration of the erase pulse is much longer than duration of the write pulse. For example, duration of the erase pulse is typically approximately forty nanosecond to appoximately four hundred nanoseconds.

Of course, such trains of multi-level pulses are likewise subject to various factors that cause changes from desired optical intensity levels. However, any such trains of multi-level pulses would be even more difficult to monitor than the simple pulses, using the previously known arrangements already discussed herein.

What is needed for consumer electronic devices is a relatively simple (and relatively easy to manufacture, use and maintain) apparatus and method for automatically analyzing and controlling intensity of a train of high speed, high power multi-level optical pulses.

SUMMARY OF THE INVENTION

The invention provides a relatively simple (and relatively easy to manufacture, use and maintain) apparatus and method for automatically analyzing and controlling intensity of a train of high speed, high power multi-level optical pulses. These aspects of the invention make it particularly advantageous for use in consumer electronics devices such as readable/re-writeable Compact Disc (CD) drives and the like.

Briefly and in general terms the invention includes an optical pulse generator for generating the train of high speed, high power, multi-level optical pulses, wherein the optical pulse generator provides a low optical intensity level and a medium optical intensity level and a high optical intensity level. A photodetector is optically coupled with the optical pulse generator for generating a train of electrical pulses having amplitude levels in response to optical intensity levels of the train of optical pulses. At least one reference is employed, wherein an analyzer electrically coupled with the reference and the photodetector for analyzing the amplitude levels of the train of electrical pulses in comparison to the reference. A controller is electrically coupled with the analyzer for generating a high correction signal based upon the analysis of the amplitude levels. The controller is coupled with the optical pulse generator for automatically controlling the high optical intensity level of the optical pulse generator based upon the high correction signal.

Other aspects and advantages of the present invention will become apparent from the following detailed description, taken in conjunction with the accompanying drawings, illustrating by way of example the principles of the invention.

DETAILED DESCRIPTION OF PREFERRED EMBODIMENTS

Figure 1:
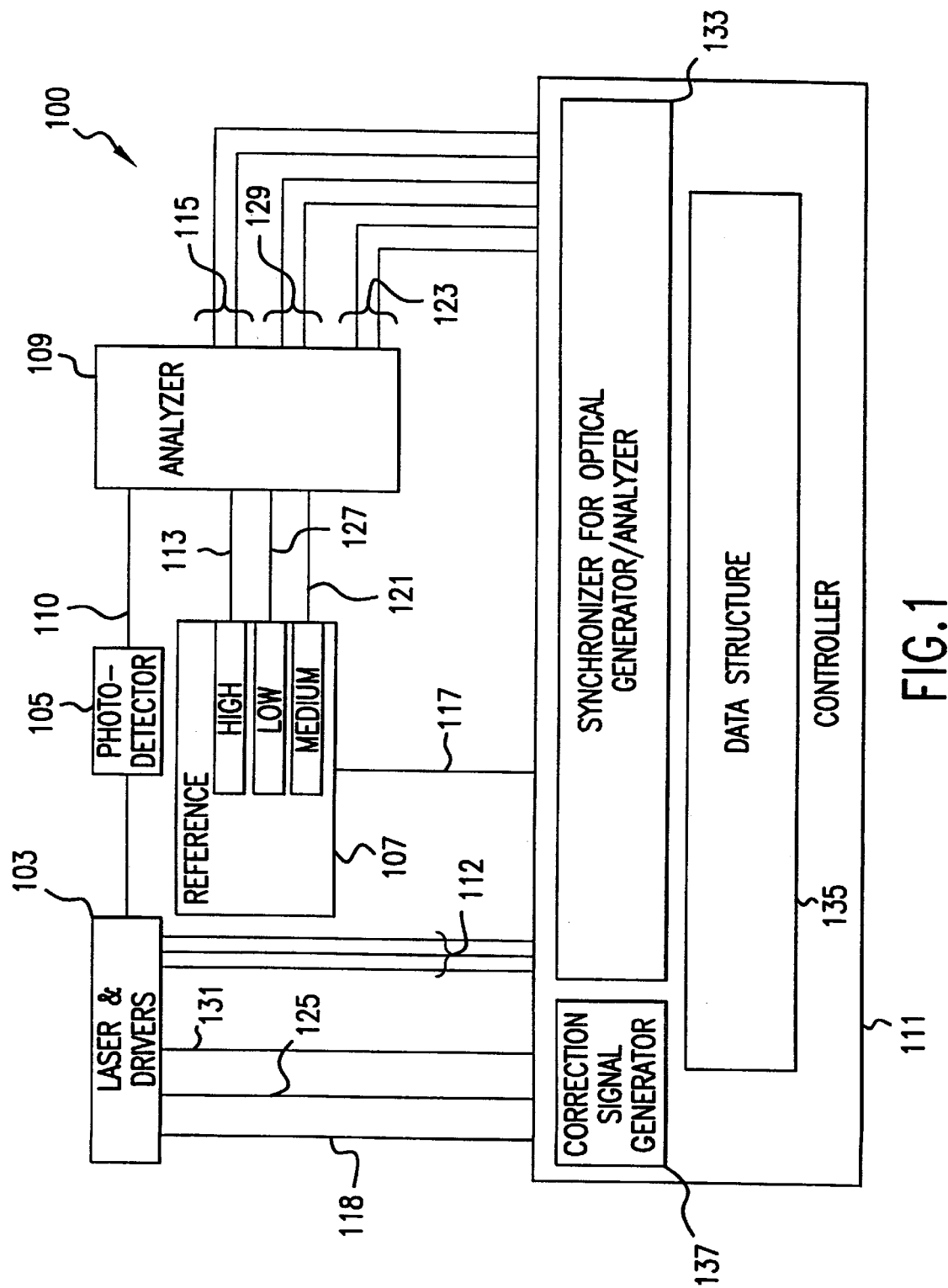
FIG. 1 is a simplified block diagram illustrating a preferred embodiment of the invention.

FIG. 1 is a simplified block diagram illustrating a preferred embodiment of the invention 100. As shown the invention includes an optical pulse generator, preferably a solid state LASER and Driver 103 for generating the train of high speed, high power, multi-level optical pulses, wherein the optical pulse generator provides a low optical intensity level and a medium optical intensity level and a high optical intensity level. Preferably, the Driver is a model 6257 current source driver model made by Elantec and the LASER is a 660 nanometer LD9451 MB LASER diode made by Toshiba.

Preferably, the optical pulse generator employed in the invention is adapted for use in consumer electronic devices such as readable/re-writeable Compact Disc (CD) drives and the like. Accordingly, as defined herein the high speed, high power optical pulses of the optical pulse generator provide write pulses within the pulse train that last for only approximately sixteen to approximately eight nanoseconds or less and have high optical intensity levels of approximately thirty to approximately one hundred milliwatts or more.

As defined herein, the multilevel aspect of the optical pulses of the optical pulse generator provide not only such high intensity level write pulses within the pulse train, but also provide within the pulse train one or more medium intensity level erase pulses, wherein such medium level erase pulses are typically limited to approximately half the intensity of the write pulses, so as to be approximately fifteen to approximately fifty milliwatts or more. Duration of the erase pulse is much longer than duration of the write pulse. For example, duration of the erase pulse is typically approximately forty nanosecond to approximately four hundred nanoseconds.

In the preferred embodiment, a minimal bias of the solid state LASER 103 provides only minimal output for example one half of a milliwatt or less as the low optical intensity level.

As shown in the figures, a photodetector 105, for example a high speed photodiode such as the PIN-020A made by UDT Sensors Inc., is optically coupled with the optical pulse generator for generating a train of electrical pulses having amplitude levels in response to optical intensity levels of the train of optical pulses, including a low amplitude level, a medium amplitude level and a high amplitude level. In the block diagram, a stippled line representatively illustrates such optical coupling between the photodetector 105 and the optical pulse generator 103.

At least one reference 107 is employed. In the preferred embodiment, electrical references provided include a high reference, and low reference and a medium reference. Speed of operation of the invention is enhanced by choosing aspects of the reference based on expectation and foreknowledge, to correspond approximately to what is expected for the amplitude values of the train of the electrical pulses (and the train of optical pulses.) Particular examples of amplitude values are discussed in further detail subsequently herein. However it should be understood that amplitude values and corresponding references vary with implementation, and therefore the principles of the invention are not strictly limited to such examples.

Preferably, the reference is implemented using one or more digital to analog converters, or voltage references. The reference is adapted for changing over a range from a first reference level to a second reference level during a period of time. Preferably, the reference includes a ramp generator for ramping in a substantially linear manner over the range from the first reference level to the second reference level during the period of time.

As shown in FIG. 1, an analyzer 109 is electrically coupled with the reference 107 and an output 110 of the photodetector 105 for analyzing the amplitude levels of the train of electrical pulses in comparison to the reference 107. A preferred embodiment of the analyzer 109 using three pairs of comparators is discussed in further detail subsequently herein.

A controller 111, preferably embodied in a suitable programmed microprocessor or as a state machine or as an arrangement of gates and registers in an application specific integrated circuit (ASIC) or field programable gate array (FPGA), is electrically coupled with the analyzer for generating a high correction signal, a medium correction signal and a low correction signal, each based upon the analysis of the amplitude levels. The controller 111 is coupled with the optical pulse generator through three main clock outputs 112 for automatically controlling each of the high, medium and low optical intensity levels of the optical pulse generator, as corrected by the respective high, medium and low correction signals.

In the preferred embodiment, the analyzer 109 includes a first pair of comparators coupled with the output 110 of the photodetector and with a high output 113 of the reference for analyzing high amplitude levels of the train of electrical pulses. The controller is coupled with outputs 115 of the first pair of comparators for determining a high reference transition time when the outputs 115 of the first pair of comparators change between a state of being substantially equal and a state of being substantially different.

The reference 107 is responsively coupled with the controller 111 though a reference command bus 117, for setting reference levels and ascertaining each of the high, medium and low amplitude levels of the train of electrical pulses, by ascertaining a respective high, medium and low level of the reference at respective high, medium and low reference transition times. The controller 111 is adapted for generating the high correction signal on an output 118 based on the high level of the reference at the high reference transition time and a predetermined desired high level.

Similarly, the analyzer 109 also includes a second pair of comparators coupled with the output 110 of the photodetector and with a medium output 121 of the reference for analyzing medium amplitude levels of the train of electrical pulses. The controller is coupled with outputs 123 of the second pair of comparators for determining the medium reference transition time when the outputs of the second pair of comparators change between a state of being substantially equal and a state of being substantially different. The controller is adapted for generating a medium correction signal on an output 125 based on the medium level of the reference at the medium reference transition time and a predetermined desired medium level.

Additionally, the analyzer also includes a third pair of comparators coupled with the output 110 of the photodetector and with a low output 127 the reference for analyzing low amplitude levels of the train of electrical pulses. The controller is coupled with outputs 129 of the third pair of comparators for determining a low reference transition time when the outputs of the third pair of comparators change between a state of being substantially equal and a state of being substantially different. The controller is adapted for generating a low correction signal 131 based on the low level of the reference at the low reference transition time and a predetermined desired low level.

In the preferred embodiment, the controller 111 achieves these operations using suitable digital hardware and/or software, which are representatively illustrated in the block diagram of FIG. 1 as functional blocks of a Synchronizer for Optical Generator/Analyzer 133 and a Data Structure 135, and a correction signal generator 137. For example, in the preferred embodiment the functional block of the Synchronizer for Optical Generator/Analyzer 133 is implemented in an arrangement that includes: a driver of the reference command bus 117, which in turn drives resepective digital to analog converters of the ramp generators of each of the high, medium and low outputs 113, 121, 127 of the reference 107; and logic gates for receiving the respective outputs 115, 123, 129 of each of the first, second and third pairs of comparators and for determining the respective high, medium and low reference transition times when the outputs 115, 123, 129 change independently from one another between respective states of being substantially equal and respective states of being substantially different.

The arrangement for implementing the functional block of the Synchronizer for Optical Generator/Analyzer 133 further includes three digital to analog converter (D/A) registers: a high D/A register, and medium D/A register and a low D/A register, wherein the values of each of the registers are repeatedly incremented and utilized by the driver of the reference command bus to control each of the digital to analog converters of the ramp generators of the respective high, medium and low outputs 113, 121, 127 of the reference 107.

Accordingly, in response to the controller the high output of the reference begins the ramping at the first reference level. As the controller subsequently increments the high D/A register, such incremented values are interpreted through the command bus, so as to ramp the high reference. When the logic gates signal the high reference transition time in response to the comparators, the controller stops incrementing the high D/A register and reads the accumulated high D/A register value.

Similarly, in response to the controller each of the medium and low outputs of the reference begins the ramping at respective initial medium and low reference levels. As the controller subsequently increments the medium and low D/A registers (independently of one another), such incremented values are interpreted through the command bus, so as to ramp the medium and low references (independently of one another). When the logic gates signal each of the medium and low reference transition times (which are independent of one another in response to the comparators), the controller stops incrementing the medium and low D/A registers (independently of one another) and reads the accumulated medium and low D/A register values (independently of one another).

Accordingly, the accumulated high, medium and low D/A register values are each representative of, and ascertain the respective high, medium and low amplitude levels of the train of electrical pulses, by ascertaining respective high, medium and low levels of the reference at the respective high, medium and low reference transition times.

In the preferred embodiment, the controller uses each of the accumulated high, medium and low D/A register values as respective high, medium and low key entries for consulting a look-up table of the Data Structure 135. Associated therein with each member of a respective ranges of high, medium and low key entries are corresponding respective high, medium and low correction values from among respective stored ranges of high, medium and low correction values, which are suitably derived from pre-determined desired high, medium and low levels.

It should be understood that although the look-up table is used in the preferred embodiment, the invention is not strictly limited such use of look up tables, since alternative ways of determining the high, medium and low correction values can be used with beneficial results. For example, digital signal processing control loop formulas can be used on the accumulated high, medium and low D/A register values to calculate the high, medium and low correction values.

Regardless whether look-up tables or formulas are used, the controller passes resulting high, medium and low correction values from the Data Structure to the Correction Signal Generator 137, which then generates each of the high, medium and low correction signals in respective response thereto on the respective high correction output 118, medium correction output 125 and low correction output.

For example, if the high level intensity of the train of optical pulses corresponding to some initial write pulses is forty milliwatts, then the corresponding high level amplitude of the train of electrical pulses generated by the photodetector (as suitably amplified) would have a corresponding value of, for example, four volts.

In response to the controller, the reference command bus 117 drives the high output of the reference so that the reference begins ramping at the first reference level, (for example, using a command representing a two volt level). As the controller subsequently increments the high D/A register, such incremented values are interpreted through the command bus, so as to ramp the high reference. The controller continues incrementing the high D/A register as the driver of the reference command bus 117 commensurately drives the digital to analog converter of the ramp generator of the high output 113 up to four volts.

At that time, the high reference transition time has been reached, and the logic gates of the Sychronizer for Optical Generator/Analyzer monitoring the outputs 115 of the first pair of comparators detect that the outputs 115 of the first pair of comparators change between the state of being substantially equal and the state of being substantially different. When the logic gates signal the high reference transition time in response to the comparators, the controller stops incrementing the high D/A register and reads the accumulated high D/A (ten bit) register value, for example 1A0 in Hexadecimal.

The controller uses the accumulated high D/A register value (in this example 1A0 Hexadecimal) as a key entry for consulting the look-up table of the Data Structure 135. Associated therein with the key 1A0 Hexadecimal is a corresponding high correction value of 1E0 Hexadecimal, which is suitably derived from a pre-determined desired high level of thirty millwatts of optical intensity.

Then the controller passes the resulting high correction value of 1E0 Hexadecimal from the Data Structure to the Correction Signal Generator 137, which then generates the high correction signal in response thereto on the output 118. For example, the Correction Signal Generator preferably includes a digital to analog converter that turns the high correction value of 1E0 Hexadecimal into the high correction signal, decreasing drive by one volt (from four to three volts.) In response, the current source driver and the solid state LASER reduces the high level intensity of subsequent write pulses within the train of optical pulses from forty milliwatts to the desired thirty milliwatts. Generation of the medium and low correction signals occurs in a similar manner.

Similarly, in the preferred embodiment the functional block of the Synchronizer for Optical Generator/Analyzer 133 is implemented in an arrangement that includes logic gates for receiving the outputs 123 of the second pair of comparators for determining the medium reference transition time when the outputs 123 of the second pair of comparators change between a state of being substantially equal and a state of being substantially different, and further includes logic gates for receiving the outputs 129 of the third pair of comparators for determining the low reference transition time when the outputs 129 of the third pair of comparators change between a state of being substantially equal and a state of being substantially different.

At each of the medium reference transition time and the low reference transition time, the controller consults the look up table of the Data Structure 135 using the respective corresponding dumped accumulated medium and low D/A register values. At such times the controller passes an appropriate resulting medium correction value or resulting low correction value from the Data Structure as required to the Correction Signal Generator, which then generates the appropriate medium correction signal or low correction signal in response thereto on the respective outputs 125, 131.

Figure 2:
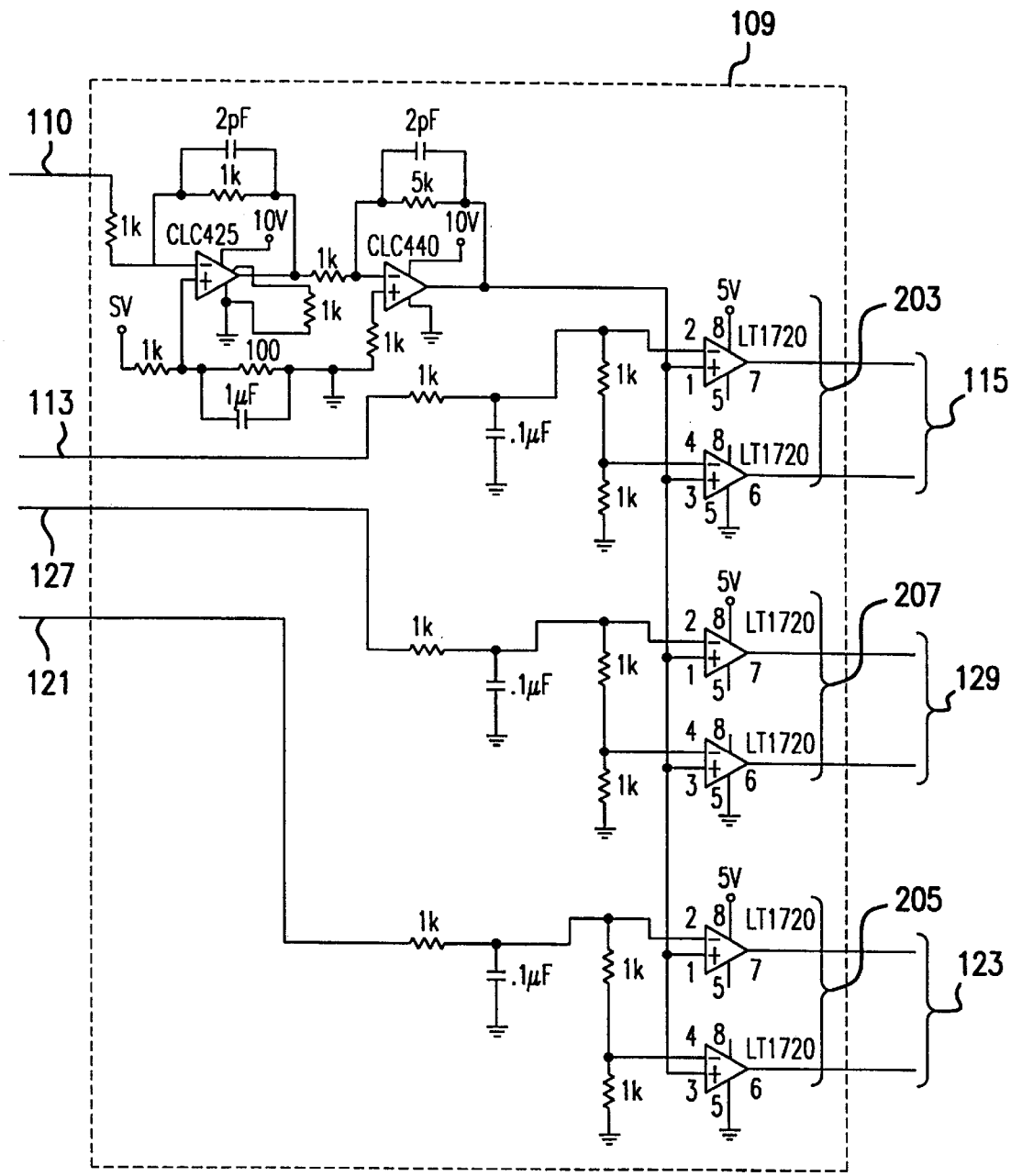
FIG. 2 is a schematic diagram of the analyzer block shown in FIG. 1.

FIG. 2 is a schematic diagram of the analyzer block 109 shown in FIG. 1. As shown in FIG. 2 the analyzer includes the first pair of comparators 203, the second pair of comparators 205 and the third pair of comparators 207 each suitably biased and each coupled with their respective pair of outputs 115, 123, 129 of the comparators. Appropriate comparators for use in the invention include the model LT1720 comparators made by Linear Technology Inc. or suitable equivalents.

As shown in FIG. 2, each of the comparators 203, 205, 207 are coupled with the output 110 of the photodiode though a suitably biased chain of selected operational amplifiers. Appropriate operational amplifiers for use in the invention include the model CLC425 and model CLC440 operational amplifiers made by National Semiconductor or suitable equivalents. As shown in FIG. 2, each of the outputs 113, 121, 127 of the reference are coupled with a respective one of the comparators 203, 207, 205.

Figure 3A:
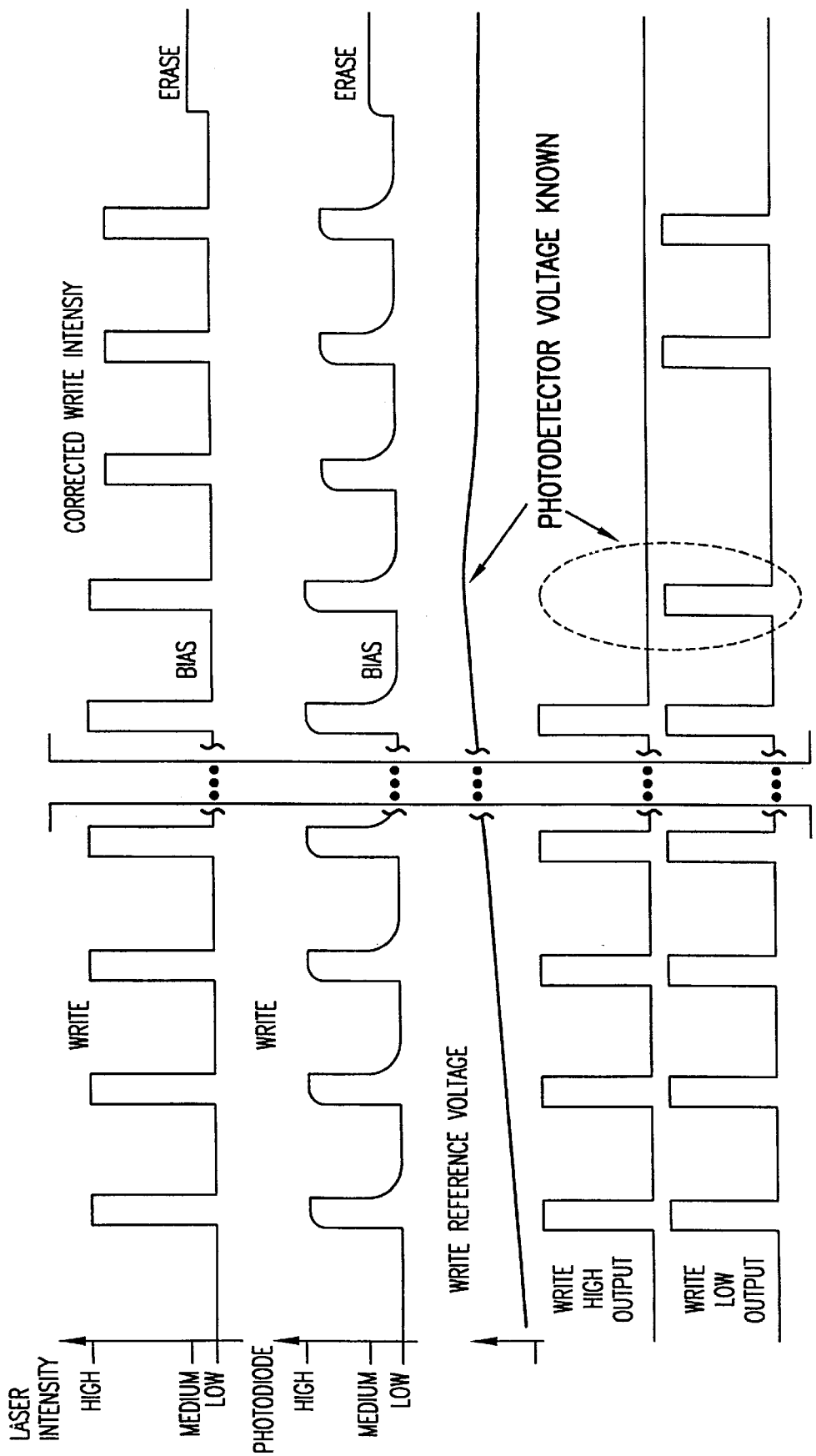
FIGS. 3A–3C are timing diagrams illustrating operation of the preferred embodiment of the invention.
Figure 3B:
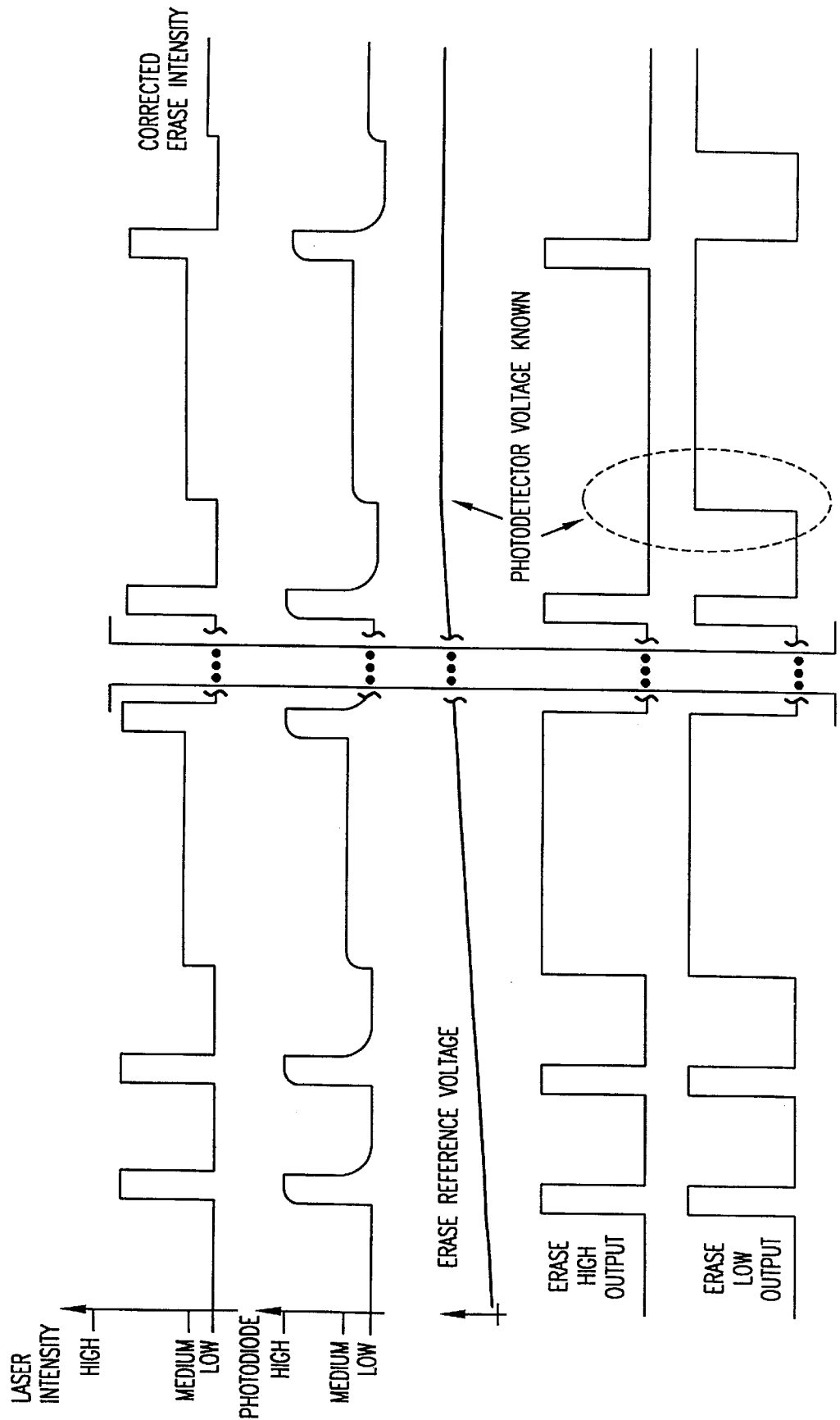
Figure 3C:
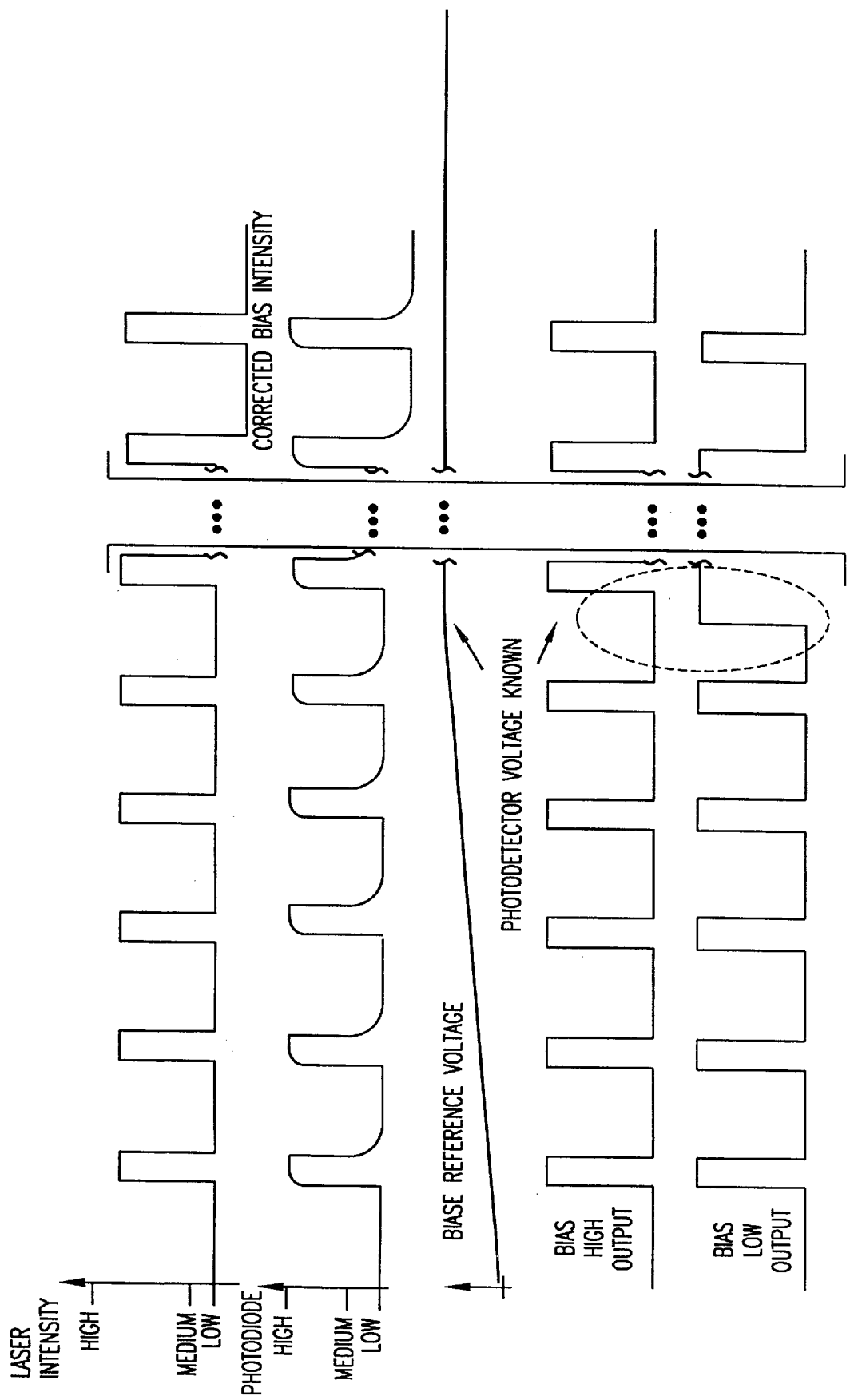

FIGS. 3A–3C are timing diagrams illustrating operation of the preferred embodiment of the invention. As shown in FIG. 3A, a first trace labeled as LASER Intensity shows the train of high speed, high power, multi-level optical pulses, providing the low optical intensity level and the medium optical intensity level and the high optical intensity level. As labeled, the train of high speed, high power optical pulses provide write pulses within the pulse train that last for only approximately for only approximately sixteen to approximately eight nanoseconds or less. As shown, initial write pulses have high optical intensity levels of approximately forty milliwatts, which is higher than desired. As labeled, the multilevel optical pulses of the optical pulse generator provide not only such high intensity level thirty write pulses within the pulse train, but also provide within the pulse train one or more medium intensity level erase pulses, which are limited to approximately half of the write pulse intensity, or approximately fifteen to approximately fifty milliwatts or more. As labeled, minimal bias provides only minimal or zero output as the low optical intensity level.

A second trace labeled in FIG. 3A as Photodiode shows the train of electrical pulses generated by the photodetector in response to the train of optical pulses. The train of electrical pulses has amplitude levels corresponding to optical intensity levels of "write", "erase" and "bias" of the train of optical pulses, including a low amplitude level, a medium amplitude level and a high amplitude level, as labeled in the second trace of FIG. 3A.

A third trace labeled in FIG. 3A as "write reference voltage" shows the high output of the reference ramping in the substantially linear manner over the range from the first reference level shown on the left hand side of the trace to the second reference level during the period of time, for example fifty microseconds, which is shown as spanning the third trace from left to right. Of course, the write pulses are quite brief (on the order of nanoseconds) and the period of time spanning the timing diagrams of the figures is on the order of tens of microseconds (which is a much much longer period of time, relatively speaking). Accordingly, in the timing diagrams of FIGS. 3A–3C, central portions of the timing diagrams are shown as omitted, so as to fairly represent the brief write pulses amid the much longer time scale spanning the timing diagrams, over which the outputs of the reference are ramped.

In FIG. 3A, the fourth and fifth traces each respectively labeled in FIG. 3A as "write high output" and "write low output" are the outputs of the first pair of comparators. As shown with reference arrows, the write reference voltage reaches the measured write voltage at the high reference transition time, as indicated in FIG. 3A by the dashed ellipse showing when the outputs of the first pair of comparators change between a state of being substantially equal and a state of being substantially different.

As shown in the first trace labeled LASER Intensity, after the high reference transition time, the invention generates the high correction signal, in the manner discussed previously herein, so that intensity of a subsequent three pulses is decreased from the excessively high intensity of forty milliwatts to the desired intensity of thirty milliwatts, which is labeled as the corrected write intensity in FIG. 3A.

As shown in FIG. 3B, the first trace is labeled as LASER Intensity, showing the train of high speed, high power, multi-level optical pulses, providing the low optical intensity level and the medium optical intensity level and the high optical intensity level. The second trace labeled in FIG. 3B as Photodiode shows the train of electrical pulses generated by the photodetector in response to the train of optical pulses. A third trace shows the medium output of the reference.

The fourth and fifth traces each respectively labeled as "erase high output" and "erase low output" are the outputs of the second pair of comparators. As shown with reference arrows, the erase reference voltage reaches the measured erase voltage at the medium reference transition time, as indicated in FIG. 3B by the dashed ellipse showing when the outputs of the second pair of comparators change between a state of being substantially equal and a state of being substantially different.

As shown in the first trace labeled LASER Intensity, after the medium reference transition time, the invention generates the medium correction signal, in the manner discussed previously herein, so that intensity of a subsequent erase pulses is decreased from what is deemed in this example to be a excessively high intensity of fifteen milliwatts to the desired intensity of twelve milliwatts, which is labeled as the corrected write intensity in FIG. 3B.

As shown in FIG. 3C, the first trace is labeled as LASER Intensity, showing the train of high speed, high power, multi-level optical pulses, providing the low optical intensity level and the medium optical intensity level and the high optical intensity level. The second trace labeled in FIG. 3C as Photodiode shows the train of electrical pulses generated by the photodetector in response to the train of optical pulses. A third trace shows the low output of the reference. The fourth and fifth traces each respectively labeled as "bias high output" and "bias low output" are the outputs of the third pair of comparators. The bias reference voltage maintains the measured bias voltage at the each of the low reference transition times, as indicated in FIG. 3C by the dashed ellipse showing when the outputs of the third pair of comparators change between a state of being substantially equal and a state of being substantially different.

As shown in the first trace labeled LASER Intensity, after the low reference transition time, the invention generates the low correction signal, in the manner discussed previously herein, so that intensity of a subsequent bias intensity level of the pulse train is decreased from what is deemed in this example to be a excessively high intensity of one and two tenths of a milliwatt to the desired intensity of eight tenths of a milliwatt, which is labeled as the corrected bias intensity in FIG 3C.

While in the preferred embodiment a respective pair of comparators is used in determining each of the transition times, in an alternative embodiment of the invention a single comparator is used for determining a transition time, while a reference is dithered. Accordingly, block diagrams and schematics for the alternative embodiment are generally similar as in the preferred embodiment discussed previously herein with respect to FIGS. 1 and 2. However, whereas circuitry is duplicated in each pair of comparators for the preferred embodiment, in the alternative embodiment there is no need for such duplication. Additionally, whereas the Reference is responsive to the Synchronizer for Optical Generator/Analyzer for linearly ramping one or more outputs of the Reference in the preferred embodiment, in the alternative embodiment the Reference is responsive to the Synchronizer for Optical Generator/Analyzer suitably programmed for dithering one or more of the outputs of the Reference in cyclic approximations as discussed in further detail subsequently herein.

Figure 4:
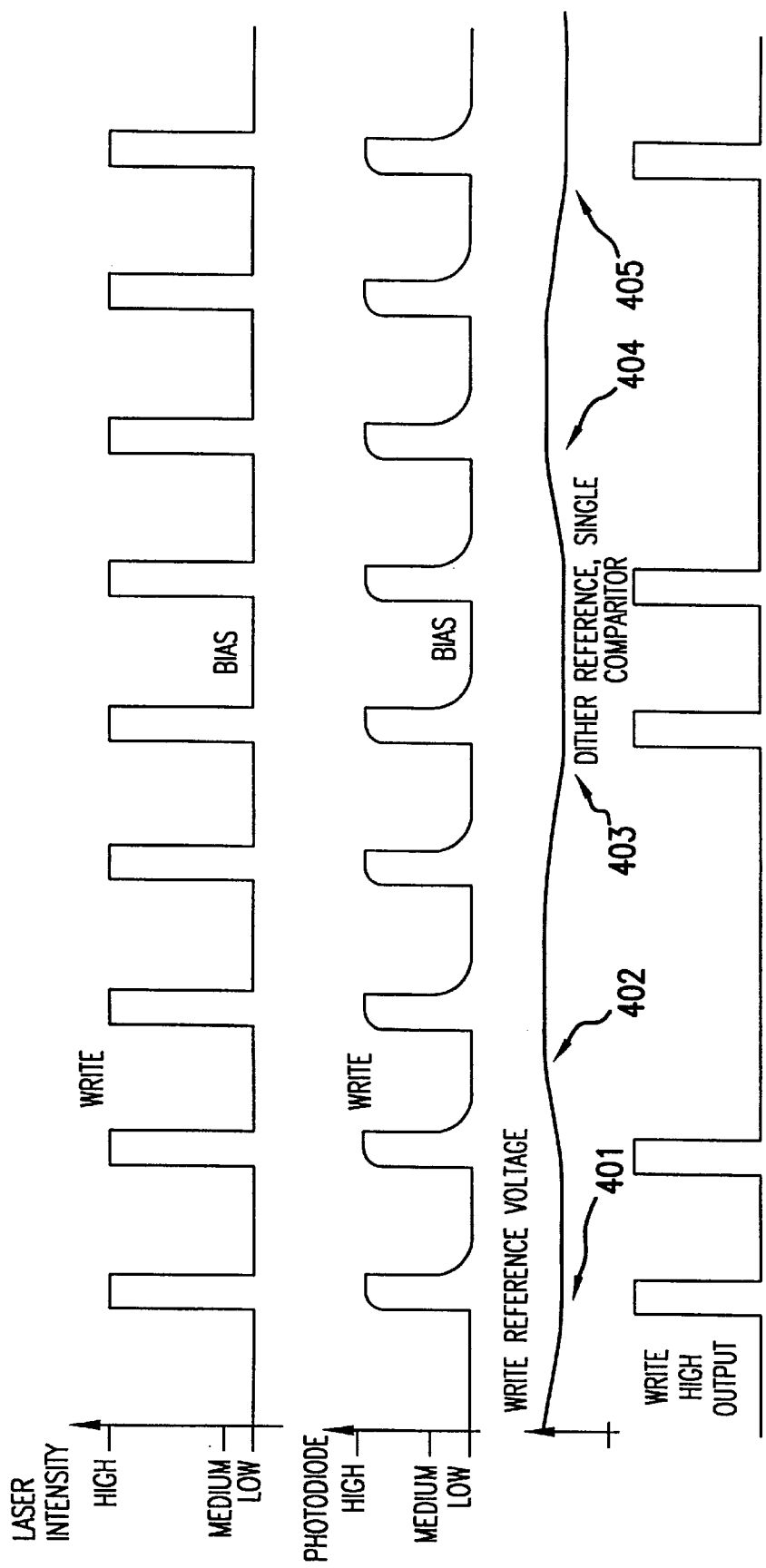
FIG. 4 is a timing diagram illustrating operation of an alternative embodiment of the invention.

FIG. 4 is a timing diagram illustrating operation of an alternative embodiment of the invention. As shown in FIG. 4, the first trace is labeled as LASER Intensity, showing the train of high speed, high power, multi-level optical pulses, providing the low optical intensity level and the medium optical intensity level and the high optical intensity level. The second trace labeled in FIG. 4 as Photodiode shows the train of electrical pulses generated by the photodetector in response to the train of optical pulses.

A third trace labeled in FIG. 4 as "write reference voltage" shows the high output of the reference dithering in cyclic approximations of the high level of the train of electrical pulses: down to a first reference level 401 (substantially at the high level of the train of electrical pulses) shown on the left hand side of the trace; then up to a second reference level 402 (above the high level of the train of electrical pulses), then down to a third reference level 403 (substantially at the high level of the train of electrical pulses); then up to a fourth reference level 404 (above the high level of the train of electrical pulses); then down to a fifth reference level 405, substantially at the high level of the train of electrical pulses.

The fourth trace labeled in FIG. 4 as "write high output" is the output of the comparator of the alternative embodiment. When the write reference voltage substantially reaches the high level of the train of electrical pulses at the high reference transition times, the comparator outputs pulses, as shown in the forth trace of FIG. 4. When the write reference voltage rises above the high level of the train of electrical pulses, then the comparator ceases outputting pulses, as shown in the forth trace of FIG. 4.

For example: when the write reference voltage reaches the first reference level 401 (substantially at the high level of the train of electrical pulses), the comparator outputs pulses; when the write reference voltage reaches the second reference level 402 (above the high level of the train of electrical pulses), the comparator ceases outputting pulses; and when the write reference voltage reaches the third reference level 403 (substantially at the high level of the train of electrical pulses), the comparator once again outputs pulses.

As discussed, the invention advantageously provides a relatively simple apparatus and method for automatically analyzing and controlling intensity of a train of high speed, high power multi-level optical pulses. Although specific embodiments of the invention have been described and illustrated, the invention is not to be limited to the specific forms or arrangements of parts so described and illustrated, and various modifications and changes can be made without departing from the scope and spirit of the invention. For example, beneficial results could be provided by ramping intensity of the optical pulse generator while holding the reference constant. Within the scope of the appended claims, therefore, the invention may be practiced otherwise than as specifically described and illustrated.

What is claimed is:

1. An apparatus comprising:
    an optical pulse generator for generating a train of high speed, high power, multi-level optical pulses, wherein the optical pulse generator provides at least a low optical intensity level and a medium optical intensity level and a high optical intensity level;
    a photodetector optically coupled with the optical pulse generator for generating a multi-level train of electrical pulses having amplitude levels in response to optical intensity levels of the train of optical pulses, including a low amplitude level, a medium amplitude level and a high amplitude level;
    at least one reference; and
    a multi-level analyzer electrically coupled with the reference and the photodetector for analyzing the amplitude levels of the train of multi-level electrical pulses in comparison to the reference; and
    a controller coupled with the reference for ascertaining the high amplitude levels within the multi-level train of electrical pulses;
    wherein the controller is electrically coupled with analyzer for generating a high correction signal.

2. An apparatus as in claim 1 wherein the controller is coupled with the optical pulse generator for controlling the high optical intensity level of the optical pulse generator based upon the high correction signal.

3. An apparatus as in claim 1 wherein the reference is a variable reference having output that changes over a range from a first reference level to a second reference level during a period of time.

4. An apparatus as in claim 1 wherein the reference includes a ramp generator for ramping in a substantially linear manner over a range from a first reference level to a second reference level during a period of time.

5. An apparatus as in claim 1 wherein the analyzer includes a first pair of comparators coupled with the photodetector and with the reference for analyzing high amplitude levels of the train of electrical pulses.

6. An apparatus as in claim 5 wherein the controller is coupled with outputs of the first pair of comparators for determining a high reference transition time when the outputs of the first pair of comparators change between a state of being substantially equal and a state of being substantially different.

7. An apparatus as in claim 6 wherein the controller is coupled with the reference and synchronized therewith for ascertaining the high amplitude levels of the train of electrical pulses by ascertaining a high level of the reference at the high reference transition time.

8. An apparatus as in claim 6 wherein the controller is adapted for generating the high correction signal based on the high level of the reference at the high reference transition time and a predetermined desired high level.

9. An apparatus as in claim 1 wherein the analyzer includes a second pair of comparators coupled with the photodetector and with the reference for analyzing medium amplitude levels of the train of electrical pulses.

10. An apparatus as in claim 9 wherein the controller is coupled with outputs of the second pair of comparators for determining a medium reference transition time when the outputs of the second pair of comparators change between a state of being substantially equal and a state of being substantially different.

11. An apparatus as in claim 10 wherein the controller is adapted for generating a medium correction signal based on the medium level of the reference at the medium reference transition time and a predetermined desired medium level.

12. An apparatus as in claim 1 wherein the analyzer includes a third pair of comparators coupled with the photodetector and with the reference for analyzing low amplitude levels of the train of electrical pulses.

13. An apparatus as in claim 12 wherein the controller is coupled with outputs of the third pair of comparators for determining a low reference transition time when the outputs of the third pair of comparators change between a state of being substantially equal and a state of being substantially different.

14. An apparatus as in claim 13 wherein the controller is adapted for generating a low correction signal based on the low level of the reference at the low reference transition time and a predetermined desired low level.

15. A method comprising the steps of:

generating a train of high speed, high power, multi-level optical pulses, so as to provide a low optical intensity level and a medium optical intensity level and a high optical intensity level;

using a photodetector to generate a train of multi-level electrical pulses having low, medium and high amplitude levels in response to the optical intensity levels of the train of optical pulses;

analyzing the amplitude levels of the train of multi-level electrical pulses in comparison to at least one reference;

ascertaining the high amplitude levels from among the low, medium and high amplitude levels within the train of multi-level electrical pulses; and generating a high correction signal based upon the analysis of the amplitude levels.

16. A method as in claim 15 further comprising the steps of controlling the high optical intensity level based upon the high correction signal.

17. A method as in claim 15 wherein the analyzing step includes:

analyzing high amplitude levels of the train of electrical pulses using a first pair of comparators coupled with the photodetector and with the reference; and monitoring outputs of the first pair of comparators;

determining a high reference transition time when the outputs of the first pair of comparators change between a state of being substantially equal and a state of being substantially different; and generating the high correction signal based on the high level of the reference at the high reference transition time and a desired high level.

18. A method as in claim 15 wherein the analyzing step includes:

analyzing medium amplitude levels of the train of electrical pulses using a second pair of comparators coupled with the photodetector and with the reference;

monitoring outputs of the second pair of comparators;

determining a medium reference transition time when the outputs of the second pair of comparators change between a state of being substantially equal to a state of being substantially different; and generating a medium correction signal based on the medium level of the reference at the medium reference transition time and a desired medium level.

19. A method as in claim 15 wherein the analyzing step includes:

analyzing low amplitude levels of the train of electrical pulses using a third pair of comparators coupled with the photodetector and with the reference;

monitoring outputs of the third pair of comparators;

determining a low reference transition time when the outputs of the third pair of comparators change between a state of being substantially equal to a state of being substantially different; and generating a low correction signal based on the low level of the reference at the low reference transition time and a desired low level.

20. An apparatus comprising:

an optical pulse generator for generating a train of high speed, multi-level optical pulses;

a photodetector coupled with the optical pulse generator for generating multi-level electrical pulses;

a reference;

a multi-level analyzer coupled with the reference and the photodetector for analyzing amplitudes of the multi-level electrical pulses in comparison to the reference; and a controller coupled with the analyzer and the reference for ascertaining high amplitude levels from among low, medium and high amplitude levels within the multi-level electrical pulses; and coupled with the generator for providing a correction signal thereto.

* * * * *